United States Patent [19]

Rössler

[11] 4,161,039
[45] Jul. 10, 1979

[54] N-CHANNEL STORAGE FET

[75] Inventor: Bernward Rössler, Munich, Fed. Rep. of Germany

[73] Assignee: Siemens Aktiengesellschaft, Berlin & Munich, Fed. Rep. of Germany

[21] Appl. No.: 875,700

[22] Filed: Feb. 6, 1978

Related U.S. Application Data

[63] Continuation-in-part of Ser. No. 750,860, Dec. 15, 1976, Pat. No. 4,087,795.

[51] Int. Cl.² ............................................. G11C 11/40
[52] U.S. Cl. .................................... 365/185; 307/238; 365/218
[58] Field of Search .................... 307/304; 357/23, 24; 365/185, 218, 114

[56] References Cited

U.S. PATENT DOCUMENTS

| 3,660,819 | 5/1972 | Frohman-Bentchkowsky | 317/235 |
| 3,662,187 | 5/1972 | Ayres et al. | 307/229 |
| 3,728,695 | 4/1973 | Frohman-Bentchkowsky | 307/238 |
| 3,797,000 | 3/1974 | Agusta et al. | 365/185 |
| 3,825,945 | 7/1974 | Masuoka | 357/23 |
| 3,893,085 | 7/1975 | Hansen | 307/238 |
| 3,936,811 | 2/1976 | Horninger | 307/238 |
| 3,938,108 | 2/1976 | Salsbury et al. | 307/238 |
| 3,952,325 | 4/1976 | Beale et al. | 357/23 |

FOREIGN PATENT DOCUMENTS 2445078 0000 Fed. Rep. of Germany.

OTHER PUBLICATIONS

Iizuka Article, Supplement to the Journal of the Japan Soc. of Applied Physics, vol. 42, 1973, pp. 158-162.
Frohman-Bentchkowsky, Solid State Electronics, 1974, vol. 17, pp. 517-529.
Tarui, et al., Journal of Solid State Circuits, SC-7, No. 5, Oct. 1972, pp. 369-375.
Tarui, et al., Proc. 3rd Conf. on Solid State Devices, Tokyo, 1971, pp. 155-162.
Japanese Patent Application 48575/72, with English Trans. "Electronics", Guoge et al., Feb. 15, 1971, pp. 99-104.
Motorola Semiconductors Handbook, First Edition, Oct. 1973, pp. 6-20, 6-21, and 14-29.
Verwey, et al., IEEE Transactions on Electron Devices, vol. ED-21, No. 10, 1974, pp. 631-636.
Rogers, et al., IEEE Journal of Solid State Circuits, vol. SC-11, No. 5, Oct. 1976, pp. 614-621.

Primary Examiner—Terrell W. Fears
Attorney, Agent, or Firm—Hill, Van Santen, Steadman, Chiara & Simpson

[57] ABSTRACT

A D-MOS storage FET is disclosed having a floating and a controllable gate. A storage matrix with such D-MOS FETs is also disclosed. Data words can be read out and can be programmed from several bits. Ultraviolet light is used for erasing. The storage FETs can be used for storages in data processing equipment including telephone exchange equipment.

11 Claims, 4 Drawing Figures

N-CHANNEL STORAGE FET

RELATED APPLICATION

This is a continuation-in-part application of my copending U.S. application Ser. No. 750,860, filed Dec. 15, 1976 now U.S. Pat. No. 4,087,795.

BACKGROUND OF THE INVENTION

The invention deals with a n-channel storage FET having at least one gate, namely a floating storage gate which is surrounded on all sides by an insulator. The recharging of the storage gate is effected by channel injection which injects electrons, i.e., recharging by electrons which are strongly accelerated in their own conductive channel and are thereby heated and which, on account of their heating, by means of an electrical field acting in the source-drain direction, overcome the energy threshold to the conductivity band of the insulator and thus reach the storage gate. The channel injection is employed for the programming, and thus the charging of the storage gate so that following this charging, the storage gate exerts a restricting force upon the source-drain path by means of its negative charge which influences the source-drain current.

U.S. application Ser. No. 750,860 now U.S. Pat. No. 4,087,795 has already stated that with a storage FET of this type, in the unprogrammed state the channel is of the depletion type. It is also stated in U.S. application Ser. No. 750,860 now U.S. Pat. No. 4,087,795 that the storage FET can consist of an additional, controllable control gate which possesses a terminal and which exerts a capacitive influence upon the storage gate. The storage FET is provided in particular for program stores of a telephone exchange system.

SUMMARY OF THE INVENTION

It is an object of the invention to construct a storage FET which possesses a storage gate and a control gate in such manner that operating voltages required are as low as possible, that the electric programmability is thus maintained, and that the known programming voltage required for programming which must be higher than the normal operating voltage does not involve the danger that a breakthrough between the source-drain path of the FET will occur under the influence of this higher voltage. The FET is also to possess a high operating speed. The FET was developed in particular for use in a telephone exchange system.

For the realization of this object, the invention employs the known technique of double-diffused MOS-FETs. In transistors of this kind, the channel length is determined by the thickness of a P-doped P layer segment which is formed in the N-doped substrate with the aid of a double diffusion beneath and directly beside a N+doped N+ layer segment (see "Electronics", Feb. 1971, pgs. 99 to 104) These D-MOS FETs can in fact be produced with a channel length of approximately 1 micrometer. They can also possess a high operating speed. However, they have the disadvantage that they possess only one gate and that therefore they are not suitable as storage FETs if the storage cell which must in each case accommodate one bit must consist only of one storage FET. Furthermore, these known D-MOS FETs cannot be used to construct stores which are electrically programmable. The invention now provides a solution to these difficulties and, where suitable, employs the known technique for the construction of D-MOS FETs.

Accordingly, the invention begins with a n-channel storage FET having at least one gate, namely a floating storage gate which is surrounded on all sides by an insulator, wherein the storage gate is recharged by means of channel injection which injects electrons, i.e., recharging by electrons which are heavily accelerated in their own conductive channel and are thereby heated, and which on account of their heating, through an electric field acting in the source-drain direction, overcome the energy threshold to the conductivity band of the insulator and thus reach the storage gate. The channel injection is employed for the programming, thus the charging, of the storage gate, so that following this charging, the storage gate exerts a restrictive force on the source-drain path by means of its negative charge by influencing the source-drain current, wherein, in the unprogrammed state its channel is of the depletion type, and wherein an additional, controllable gate is provided which possesses a terminal and which exerts a capacitive influence upon the storage gate, as claimed in German Patent application No. P 24 45 137. The storage FET in accordance with the invention is characterized in that it is constructed as a D-MOS FET, and that its channel length is determined by the thickness of a P-doped, P layer segment which is formed in the N-doped substrate with the aid of a double diffusion below and directly beside a N+doped N+ layer segment. The N+ layer segment arranged directly beside the P layer segment constitutes the source terminal. The drain terminal is a diffused-in, N+doped N+layer segment arranged at a distance. This distance forms a drift path and this distance is equal to or greater than the thickness of the P layer segment on the side facing away from the source terminal. The storage gate and the control gate are arranged in insulated fashion above the surface of the substrate in such manner that they are able to influence the channel path.

Due to the fact that the storage FET is constructed in the described manner as a D-MOS FET with two gates, the desired advantages can be achieved. It is then, in fact, possible to achieve a channel length on the order of 1 micrometer, resulting in the advantages in respect of operating voltages and operating speed. Due to the presence of two gates, one of which is a floating storage gate, the D-MOS FET by itself can form a storage cell. Finally, on account of the presence of the drift path between the P layer segment and the drain terminal, a breakthrough between the source-drain path is avoided in spite of loading by the programming voltage which is somewhat higher than the normal operating voltage. It will be clear that a read-out voltage of approximately 5 V is sufficient for read out, whereas a programming voltage of approximately 12 V is sufficient for programming.

Expediently a storage FET of this type is erased by irradiation with ultraviolet light. This is also the case when a plurality of such storage FETs are arranged on one and the same semiconductor carrier. This is facilitated if the storage gate in a FET in each case projects beyond the control gate terminal by which it would otherwise be covered. It is then ensured that the ultraviolet light acts upon the zones in question of the FET, and that the time requirement for erasure is kept short. It has been proven that it is sufficient for this purpose for the storage gate to project beyond the control gate terminal only on the side facing towards the source terminal. It can then also be ensured that the storage gate does not cover the major part of the drift path. This involves the advantage that, for example, a charged storage gate is undesirably discharged when a programming sequence is carried out in an adjacent FET lying on the side of the drain terminal. Then the so-called neighboring word disturbance is avoided within a store having a plurality of such FETs. The storage FETs in accordance with the invention can in fact be arranged on a semiconductor carrier in a matrix, and can thus form an electronic store produced in the integrated technique.

Further details regarding the above described designs of the storage FET in accordance with the invention and further details regarding the construction for an example of an electronic store are presented below.

DESCRIPTION OF THE PREFERRED EMBODIMENTS

Figure 1:
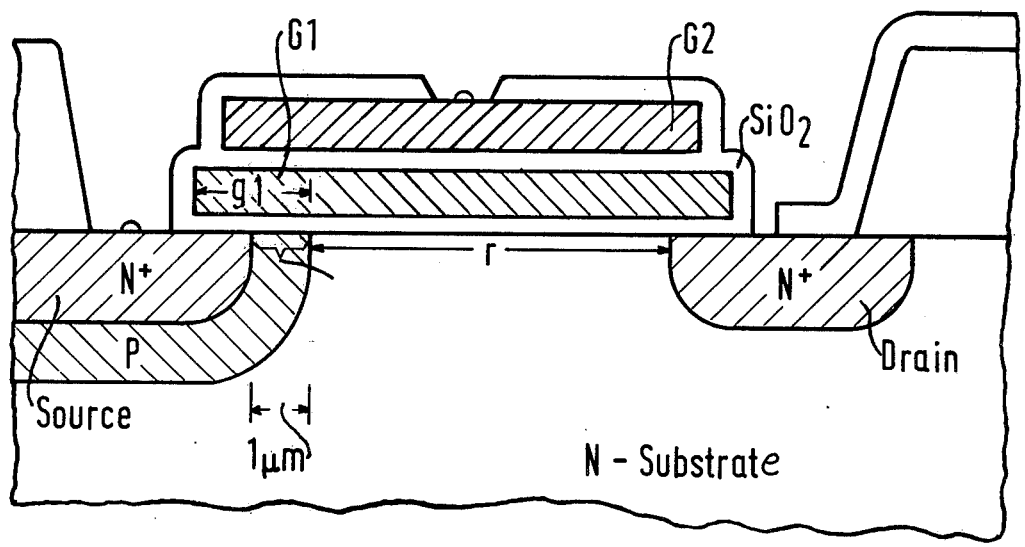
FIG. 1 shows an exemplary embodiment in section of a storage FET designed in accordance with the invention.

In the storage FET shown in FIG. 1, double-diffusion is used to diffuse in the source referenced N+ as an N+doped N+layer segment, and the P doped P layer segment referenced P. Here the channel length of 1 micrometer is achieved in the channel, for example. The drain terminal diffused in as an N+doped N+layer segment is also referenced N+. Here the distance r between the channel and the drain terminal is considerably greater than the thickness of the P layer segment. The storage gate G1 and the control gate G2 are arranged in insulated fashion above the surface of the N doped substrate. Here the insulating layers consist of silicon dioxide.

In the FET shown in FIG. 1, the storage gate G1 is designed to be relatively large. Both on the source terminal side and on the drain terminal side it projects beyond the control gate terminal G2 by which it would otherwise be covered. However, the storage gate G1 can also be considerably smaller, as already explained. For example, it is sufficient for it to extend only over the indicated length g1. In this case it projects beyond the control gate terminal only on the side facing towards the source terminal and covers only a very small part of the drift path. Then the explained advantages are achieved.

Figure 2:
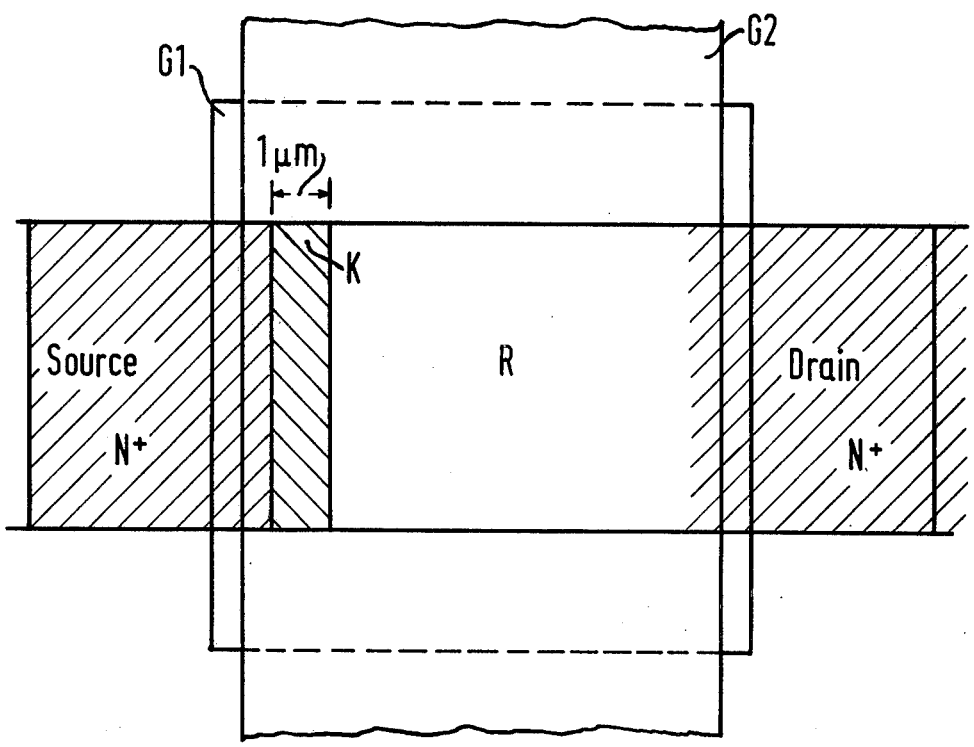
FIG. 2 schematically illustrates an example of the position of the gates and terminals belonging to a FET of FIG. 1.

FIG. 2 shows a plan for the position of the gates shown in FIG. 1 and other terminals, said plan merely illustrating the mutual assignment of the gates and the terminals in a plane at right angles to the sectional plane in FIG. 1. It will be seen that the storage gate G1 projects beyond the control gate terminal G2 by which it is otherwise covered. A source and drain are also provided. Finally the drift path referenced R is also shown.

Figure 3:
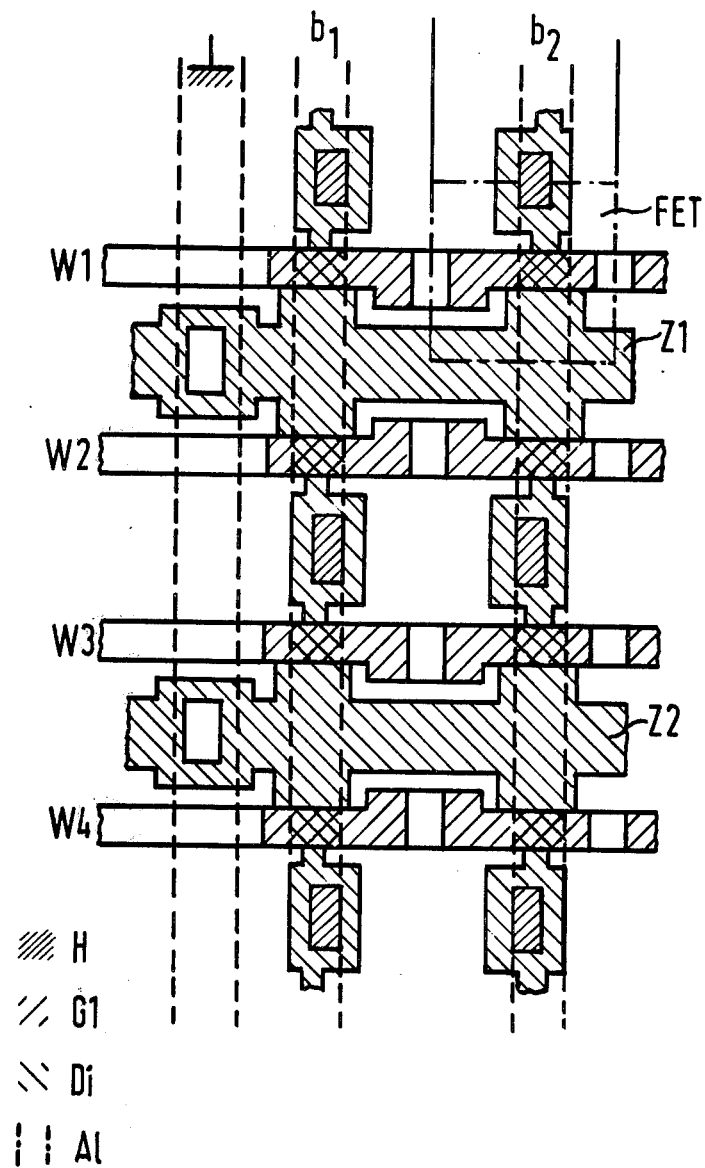
FIG. 3 illustrates an example of the distribution of storage FETs in a store and for the arrangement of associated matrix lines which can simultaneously be used as control lines.

When a FET of this type is arranged in common with further FETs on a semiconductor carrier in a matrix, an arrangement is formed, for example, as illustrated in FIG. 3. The source terminals are then connected by matrix lines Z1 and Z2 which are in each case arranged and diffused-in in parallel. The control gates are connected by the parallel matrix lines W1...W4 which consist of polysilicon. The storage gates are indicated by shading referenced G1. The drain terminals are connected via contact points H by means of matrix lines b1 and b2, which consist of aluminum, and intersect the other matrix lines at right angles. The points at which diffused-in layers are arranged are indicated by the shading referenced Di. The position of the matrix lines consisting of aluminum is also indicated by broken lines and the line symbol referenced Al (see also Siemens Forsch.-und Entwickel-Ber., Vol. 4 (1975) No. 6, pp. 345 to 351, in particular 350 and 351).

It is already known to construct a store from storage cells which are arranged in a matrix and which each contain only one single FET whose control gate is in each case connected to a control line of a first matrix dimension, and whose drain terminal is in each case connected to a control line of a further matrix dimension, and wherein all the source terminals of the storage FETs are connected to a common circuit point (see German Pat. No. 24 45 078). Expediently, in addition to the storage FETs, the associated control unit is also arranged on the same semiconductor carrier. Data words comprising a plurality of bits are read out with the aid of decoders. By means of a decoder for the first matrix dimension, one single control line is selected for the word selection. By means of a decoder for the further matrix dimension, for word selection with respect to each bit position, one of a plurality of control lines provided for each bit position is simultaneously selected (see IEEF Journal of Solid-State Circuits, Vol. SC-11, No. 5, October 1976, pp. 614 to 621, in particular page 617.). The bits in each case belonging to a word are supplied via output terminals which are individually assigned to the bit positions of the words and which are each connected to the control lines associated with the same bit position via decoupling switching means. An electronic store of this type can now also be constructed with the aid of the storage FET designed in accordance with the invention, constructed in the D-MOS technique and employed as storage cells, in which case a store is formed which has all the advantages possessed by the storage FETs made available by the invention.

Figure 4:
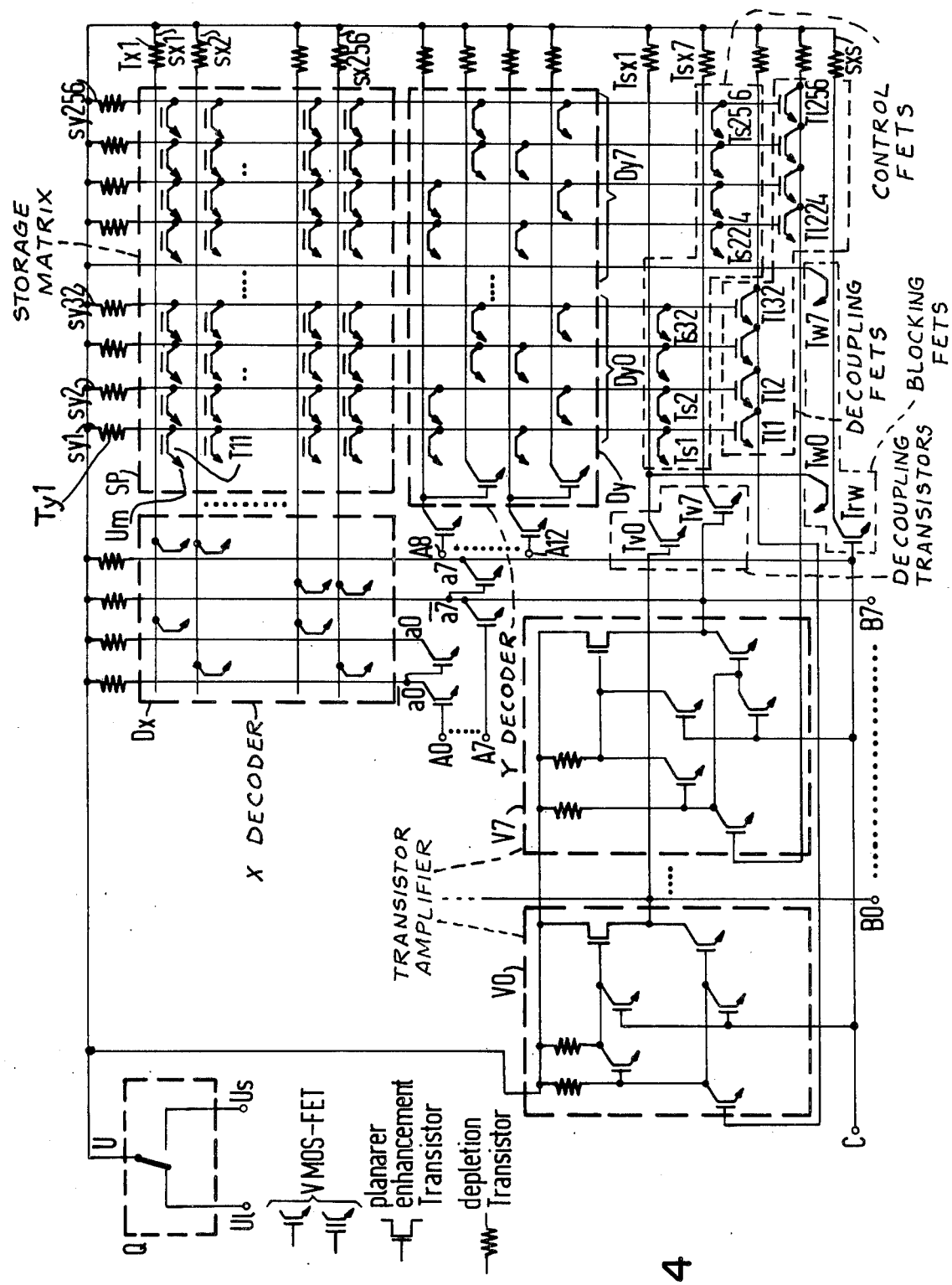
FIG. 4 shows an example of the circuit of an electronic store including the associated control unit.

In the exemplary embodiment illustrated in FIG. 4, for a store of this kind, preferably the output terminals are additionally exploited for the introduction of data words. The control lines via which the data words are supplied on read-out are in fact connected to the output terminals via transistors serving for decoupling purposes and via transistor amplifiers. At the introduction of a data word, the transistor amplifiers are blocked with the aid of blocking circuits, whereas for read-out, additional transistors to be employed, particularly for the introduction of data words, are blocked. The blocking circuits are provided for each bit position of the data words and are constructed using transistors, each of which are connected to an additional line corresponding to the control lines of the further matrix dimension. The additional exploitation of the output terminals achieves the advantage that the number of terminals required on the same semiconductor carrier remains low.

The electronic store illustrated in FIG. 4 includes a plurality of sub-circuits whose circuit elements are fundamentally interconnected in a manner known per se. The sub-circuit SP contains, as a storage component, the storage FETs which are produced in the D-MOS technique, and employed as storage cells, and which includes the transistor T11. The control gates of these transistors are connected to the control lines sx1 . . . sx256 of the first matrix dimension, to which the operating voltage U is connected via series resistors, including the series resistor Tx1. The drain terminals of the storage FETs are connected to the control lines sy1...sy256 to which the operating voltage U is likewise connected via series resistors, including the series resistor Ty1. The source terminals of all these storage FETs are connected to ground potential Um, as indicated by the reference Um of the transistor T11. A further sub-circuit is formed by the decoder Dx, with the aid of which one of the control lines sx1 . . . sx256 is selected. It is assembled in known manner employing D-MOS FETs and possesses the input terminals A0 . . . A7 via which a word address composed of eight bits can in each case be supplied. Each of these bits is assigned two lines, illustrated vertically, of this decoder which are connected to the gates of FETs. The drain terminals of these FETs are connected to control lines of the first matrix dimension. Ground potential Um is connected to all the source terminals. Each bit of a word address is assigned two of the aforementioned vertical lines, e.g., the bit supplied via the input terminal A0 is supplied with the two lines referenced a̅0 and a0. Between these two lines and the input terminal A0, two D-MOS FETs are also inserted, so that the one line is fed with the supplied bit in amplified form and the other line is fed with the supplied bit in amplified and inverted form. Correspondingly, the other input terminals are connected to the other, vertical lins of the decoder Dx via FETs. The decoder Dy is also provided, which likewise is fundamentally assembled in known manner from D-MOS FETs, and which, in the word selection for the further matrix dimension, simultaneously selects for each bit position one of a plurality of control lines provided for each bit position. This relates to the control lines sy1 . . . sy256. This decoder Dy consists of the eight sub-decoders Dy0 . . . Dy7. When a word address is supplied to the input terminals A8 . . . A12 of the decoder Dy, each of the sub-decoders selects one of the aforementioned control lines, so that a total of eight control lines from the control lines sy1 . . . sy256 are selected. The aforementioned decoders are used for the read-out and write-in of data words. The storage FETs, whose control gates are connected to one and the same control line of the first matrix level, e.g., to the control line sx1, can therefore each accommodate a total of 32 data words each comprising 8 bits. Each of the sub-decoders Dy0 . . . Dy7 must select from 32 control lines of the further matrix level. Thus the decoder Dy0 must select from the control lines sy1 . . . sy32. Also in the case of the decoder dy, the input terminals A8 . . . A12 are connected via additional D-MOS FETs to the associated control lines, as with the decoder Dx. The D-MOS FETs which belong to the decoder Dy are inserted into the circuit in the same way as those belonging to the decoder Dx.

The bits which in each case belong to a word are supplied via the output terminals B0 . . . B7 individually assigned to the bit positions of the words. The output terminal B0 is assigned to the first bit position of the words. A selection is made from the associated control lines sy1 . . . sy32 with the aid of the subdecoder Dy1. The bits to be supplied are forwarded with the aid of the D-MOS FETs T11 . . . T132, which are each individually connected by their gates to the aforementioned control lines, and whose drain terminals, which are connected to one another, are connected to the operating potential U via a series resistor. Furthermore, the connected drain terminals are connected via the transistor amplifiers V0 to the output terminal B0. Here the transistors T11 . . . T132 serve as decoupling switching means. The transistors amplifier V0 serves for the additional amplification. It is constructed in known manner. Its tri-state output consists of the output terminal B0. The other bits of data words are supplied correspondingly via transistors and transistor amplifiers which include the transistors T1224 . . . T1256 and the amplifier transistor V7, whose tri-state output is the output terminal B7. With the aid of the sub-circuit Q, which here is shown merely schematically, the operating potential U can be connected to the level of the read-out voltage U1 or at the level of the programming voltage Us. The read-out voltage U1 can amount, for example, to 5 V and the programming voltage Us for example to 12 V. This sub-circuit is an electronic switch-over device which can be connected in known manner. However, it is unnecessary for the switch-over device to be arranged on the semiconductor carrier itself.

FIG. 4 provides a further illustration of the circuit symbols used for D-MOS FETs. The source terminals each symbolized by an arrow head are always connected to earth potential Um. Planar, enhancement transistors employed in the circuit are represented by a different circuit symbol which is specially provided in FIG. 4. The series resistors of the control lines and other lines, such as the series resistors Ty1, Tx1, Tsx1, can also be formed by depletion transistors whose gates are each connected to their sources. The circuit symbol employed for this purpose is likewise specially provided in FIG. 4. The subsidiary devices of the store shown in FIG. 4, which must be used for the read-out of data words, have already been dealt with above. The storage FETs which contain a data word are each partially programmed and partially unprogrammed as described in U.S. application Ser. No. 750,860. In the case of a programmed storage FET, the floating storage gate is negatively charged. Therefore it is not rendered conductive during a read-out process. The read-out voltage U1 connected to the control lines sx1 and sy1 via the series resistors Tx1 and Ty1 for the read-out of data words therefore remains on the control line sy1 during the read-out of the storage FETs T11 only when this storage FET T11 is programmed. Otherwise, when it is not programmed, it is conductive and the read-out voltage U1 connected to the control line sy1 is derived via the main current path of the storage FET T11, as its source terminal is connected to ground potential Um. If, on the other hand, the storage FET T11 is programmed, the read-out voltage U1 supplied to the control line sy1 is maintained and acts via the decoupling transistor T11 and the transistor amplifier V0 on the output terminal B0 in a corresponding manner. This is conditional upon none of the D-MOS FETs connected to the control line syl being driven conductive in the decoder DyO, which is the case when the decoder Dy has selected this control line. It is also conditional upon none of the D-MOS FETs connected to the control line sx1 being driven conductive in the decoder Dx, which is the case when this control line has been selected by this decoder Dx. In this case, the other control lines sx2 ... sx256 are each conductively connected via the main current path of at least one D-MOS FET of the decoder Dx to its source terminal which is connected to the ground potential Um, so that the read-out voltage U1 is derived from these control lines. The derivation of the read-out voltage U1 from the relevant control lines in each case avoids a short-circuit due to the presence of the associated series resistors. Thus the read-out voltage only affects an output terminal in a specific fashion when the relevant storage FET is programmed during the read-out of a word. Otherwise the path leading to the relevant output terminal is subject to ground potential, which results that a different voltage than otherwise is also connected to the relevant output terminal. The above mentioned transistor T11 is assigned to the first bit of a data word. The storage FETs belonging to the other bits of the relevant data word are taken into account by the other sub-decoders of the decoder Dy. Therefore during the read-out of the data word, the other output terminals, including the output terminal B7, are likewise subject, in a specific fashion, to read-out voltage or ground potential so that the read-out data word is present at the output terminals B0 ... B7. In the case of the circuit for the store, as shown in FIG. 4, on the read-out of a programmed storage FET, the associated decoupling transistor, e.g., the decoupling transistor T11, is blocked, which results in the associated transistor amplifier — here the transistor amplifier V0 — being controlled in such manner that the read-out voltage U1 occurs across the relevant output terminal, here the output terminals B0. If, on the other hand, the relevant storage FET is programmed, the relevant decoupling transistor is not blocked and therefore the associated transistor amplifier connects ground potential to the relevant output terminal.

In order to be able to write in data words into the store correctly, the control lines sy1 ... sy256 are connected to the drain terminals of the additional control D-MOS FETs Ts1 ... Ts256, whose source terminals are connected to ground potential Um. The gates of the control D-MOS FETs Ts1 ... Ts32 are connected while the associated control lines sy1 ... sy32 are assigned to the same bit position. The operating voltage U is also connected via the series resistor Tsx1. Correspondingly, the gates of the other control D-MOS FETs are connected and the operating voltage U is connected thereto as also indicated for the control D-MOS FETs Ts224 ... Ts256 and the series resistor Tsx7. For the write in of a data word, for programming purposes the operating voltage is supplied at the level of the programming voltage Us. The decoders Dx and Dy are used for word selection during write ins as during read-out. This results in the fact that the control lines to which a storage FET associated with a selected data word is in each case connected, have the programming voltage Us since the D-MOS FETs connected to the decoders Dx and Dy are not rendered conductive. Therefore, without additional measures, all the storage FETs belonging to a selected word would be programmed. This is assuming that the store is in the original or erased state during the write in of data words. However, generally speaking, not all the storage FETs assigned to a storage word must be programmed. Here this is achieved since the control D-MOS FETs of those bit positions whose storage FETs are not to be programmed during the write in of a data word, are rendered conductive. This rendering conductive here is preferably achieved via the output terminals B0 ... B7. For this purpose, for example, the output terminal B0 is connected via the decoupling transistor Tv0 to the line leading to the series resistor Tsx1. Correspondingly, the other output terminals, including the output terminal B7, are connected to the other, corresponding lines via decoupling transistors. Here the gate of a decoupling transistor is connected to the relevant output terminal, the drain terminal to the gates of the relevant control D-MOS FETs, and the source terminal to ground potential. Accordingly, the output terminal B7 is also connected via the decoupling transistor Tv7 to the line leading to the series resistor Tsx7. If the decoupling transistors Tv0 ... Tv7 were not provided, the data word to be written in could be connected in unmodified form to the output terminals B0 ... B7, and then the control D-MOS FETs of those bit positions whose storage FETs are not to be programmed during the write in of data words, are rendered conductive. Because of the presence of the decoupling transistors Tv0 ... Tv7, on the other hand, a data word for write in into the store must in each case be fed in inverted form to the output terminals B0 ... B7. The decoupling transistors Tv0 ... Tv7 prevent the state in which the outputs of the transistor amplifiers are blocked in high-ohmic fashion, from being disturbed.

It is also necessary that the circuit components specially provided for the read out of data words and the write in of data words should not undesirably influence one another. For this purpose, the amplifier stages V0 ... V7 are blocked when a data word is written in. On the other hand, the control D-MOS FETs Ts1 ... Ts256 are blocked when a data word is read out. For this purpose, with respect to each bit position, there are provided blocking circuits which include D-MOS FETs Trw, Tw1 ... Tw8. These FETs are connected to an additional line sxs which corresponds to the control lines of the further matrix dimension and to which the operating voltage U is connected via a series resistor. On the read out of a stored word, the FETs Tw0 ... Tw7 are rendered conductive via the control terminal C and the FET Trw, whereby the control D-MOS FETs Ts1 ... Ts256 are blocked. For the write in of data words, the FETs Tw0 ... Tw7 are blocked via the terminal C and the FET Trw, and, in the transistor amplifiers V0 ... V7 which are likewise connected to the control terminal C, the tri-state outputs are blocked in high-ohmic fashion. This prevents the write in of data words from being disturbed by these amplifier stages.

In the case of the store described and with reference to FIG. 4, storage FETs which also possess a floating gate and which are constructed in the D-MOS technique, are combined in a novel fashion in a matrix. Most of the FETs which belong to the control component are D-MOS FETs, as indicated in FIG. 4 by the circuit symbols. Thus, for example, the transistor amplifiers V0 ... V7 are assembled from D-MOS FETs and planar enhancement transistors. These transistor amplifiers possess outputs which, during operation, are either blocked in high-ohmic fashion or possess one of two predetermined, comparatively low-ohmic electric states, which belong to binary output signals — thus the aforementioned tri-state outputs (see e.g., Siemens Mikroprozessoren und Mikrocomputer by Hans-Peter Lobmeyer-Bartenstein, pp. 28, 29 and McMOS-Handbook, Motorola Semiconductors, First Edition 1973, pp. 6.20, 6.21, 14.29).

It should also be noted that a storage matrix as described in the foregoing can also be advantageously constructed with the aid of other MOS-FETs having a floating gate and a control gate, which are produced without the double-diffusion technique. Also with MOS-FETs of this kind, the floating gate can be charged by means of channel injection during the programming (see e.g. German Patent application No. P 24 45 137). Under certain conditions such MOS-FETs can also be electrically erased. In any case, in a storage matrix of this kind, the described advantages regarding low cost is achieved in additional transistors for the control unit for the programming. A small number of operating voltages is also achieved. Therefore, techniques in accordance with the invention are also applied in storage matrices of this type.

Although various minor modifications may be suggested by those versed in the art, it should be understood that I wish to embody within the scope of this patent warranted hereon, all such embodiments as reasonaly and properly come within the scope of my contribution to the art.

I claim as my invention:

1. In an n-channel storage field effect transistor (FET) having:
   a source, a channel, and a drain;
   at least one gate which is a floating storage gate surrounded on all sides by an insulator including means for recharging of the storage gate by channel injection wherein electrons on account of their heating and through an electric field acting in a source-drain direction overcome an energy threshold to a conductivity band of the insulator and thus reach the storage gate;
   said channel injection being employed for programming by charging of the storage gate;
   said storage gate, due to its charge and by influencing the source-drain current, exerting a restrictive influence upon a source-drain path;
   in an unprogrammed state said channel being of a depletion type;
   an additional, controllable control gate being provided which has a terminal and in capacitive interaction with the storage gate;
   wherein the improvement comprises:
      a length of said channel being determined by a thickness of a P doped P layer segment formed in an N-doped substrate directly beside a diffused N+doped N+layer segment as a source;
      said N+layer segment being located directly beside said P layer segment;
      an N+doped N+layer segment as a drain being arranged at an interval from the P layer segment which forms a drift path, said interval being at least approximately equal to a thickness of said P layer segment between the source and the drift path;
      the storage gate and the control gate being arranged in insulated fashion above a surface of the substrate at a predetermined distance for influencing the channel path; and
      means for erasure by irradiation with ultraviolet light, said means comprising the storage gate projecting beyond the control gate by which it is otherwise covered.

2. An FET as claimed in claim 1, characterized in that the storage gate projects beyond the control gate only at a side facing towards the source.

3. An FET as claimed in claim 1, characterized in that the control gate does not cover a major portion of the drift path.

4. An n-channel storage field effect transistor, comprising:
   (a) a substrate of N type conductivity;
   (b) source and drain regions of N+ type conductivity diffused at a major surface of said substrate;
   (c) a P type region adjacent and in contact with said N+ source region;
   (d) a drift path being formed between the P type region and the drain region;
   (e) a channel being formed in the P type region between the source region and the drift path, a length of said drift path being at least equal to a length of said channel;
   (f) a storage gate being arranged in insulated fashion over said channel;
   (g) a control gate having a terminal being arranged in insulated fashion over said storage gate;
   (h) said transistor comprising a double diffusion metal-oxide-silicon field effect transistor (D-MOS FET); and
   (i) and means for ultraviolet light erasure of the storage gate.

5. The transistor of claim 4 in which the length of the drift path is substantially greater than the length of the channel.

6. The transistor of claim 4 in which said means for ultraviolet light erasure comprises a storage gate which extends beyond edges of the control gate.

7. An FET storage matrix comprising:
   (a) An n-channel storage field effect transistor (FET) comprising:
      (i) a substrate of N type conductivity;
      (ii) source and drain regions of N+ type conductivity diffused at a major surface of said substrate;
      (iii) a P type region adjacent and in contact with said N+ source region, said P type region and source region comprising a double diffusion;
      (iv) a drift path being formed between the P type region and the drain region;
      (v) a channel being formed in the P type region between the source region and the drift path, a length of said drift path being at least equal to a length of said channel;
      (vi) a storage gate being arranged in insulated fashion over said channel;
      (vii) a control gate having a terminal being arranged in insulated fashion over said storage gate;
      (viii) said transistor comprising a double diffusion metal-oxide-silicon field effect transistor (D-MOS FET); and
      (ix) means for ultraviolet light erasure of the storage gate;
   (b) a plurality of said storage FETs on a semiconductor carrier in a matrix;
   (c) the sources being connected by parallel, diffused-in matrix lines;
   (d) the control gates being connected by parallel polysilicon matrix lines; and
   (e) the drains being connected by aluminum matrix lines connected to drain contacts on the drains, said aluminum matrix lines being at right angles to the polysilicon matrix lines.

8. An FET storage assembly for the write-in of data words and the read-out of storage words comprised of a plurality of bits, comprising:
   (a) an n-channel storage field effect transistor (FET) comprising:
      (i) a substrate of N type conductivity;
      (ii) source and drain regions of N+ type conductivity diffused at a major surface of said substrate;
      (iii) a P type region adjacent and in contact with said N+ source region, said P type region and source region comprising a double diffusion;
      (iv) a drift path being formed between the P type region and the drain region;
      (v) a channel being formed in the P type region between the source region and the drift path, a length of said drift path being at least equal to a length of said channel;
      (vi) a storage gate being arranged in insulated fashion over said channel;
      (vii) a control gate having a terminal being arranged in insulated fashion over said storage gate; and
      (viii) said transistor comprising a double diffusion metal-oxide-silicon field effect transistor (D-MOS FET);
   (b) a storage matrix having a plurality of storage cells, each cell having only one of the D-MOS storage FETs;
   (c) a control gate of each storage FET connecting to a first matrix dimension control line and whose drain terminal is in each case connected to a second matrix dimension control line, and that all the source terminals of the storage FETs are connected to a common circuit point;
   (d) in addition to the storage FETs, an associated control unit is also arranged upon a common semiconductor carrier;
   (e) a first decoder means for the first matrix dimension which selects one single first matrix dimension control line for word selection;
   (f) second decoder means for the second matrix dimension which for each bit position simultaneously selects one of a plurality of second matrix dimension control lines provided for each bit position for the word selection;
   (g) output terminal means for feeding bits for the word selection, said output terminal means being individually assigned to the bit positions of the words;
   (h) decoupling switching means for connecting each of the output terminal means to said second matrix dimension control lines associated with the same bit position as the output terminal means;
   (i) source terminals of said storage FETs being connected to ground potential;
   (j) control D-MOS FETs having drain terminals connected to said second matrix dimension control lines, source terminals connected to ground potential, and gates of the control D-MOS FETs connecting to control lines of the same bit position being connected together and through a series resistance to one of said operating potentials; and
   (k) said first and second decoder means being employed for word selection in write-in and in read-out.

9. The assembly of claim 8 in which said output terminal means are additionally employed for the write-in of data words and are connected to interconnected gates of said control D-MOS FETs;
   the second matrix dimension control lines being connected to said output terminal means via decoupling D-MOS FET means and via transistor amplifier means; and
   blocking circuit means provided for each bit position and which comprise D-MOS FETs connected to an additional control line, said blocking circuit means blocking the amplifier means during write-in and blocking the control D-MOS FETs during read-out.

10. The assembly of claim 8 in which the transistor amplifier means possess tri-state output terminals, that between each outut terminal and gates of associated control D-MOS FETs there is inserted a decoupling transistor whose gate is connected to the respective output terminal, whose drain terminal is connected to the gates of the respective control D-MOS FETs, and whose source terminal is connected to ground potential, and that a data word means for inverting data words is connected to the output terminal means for supplying inverted words thereto.

11. The assembly of claim 8 in which the series resistances are formed by integrated depletion transistors whose gates are connected to their sources.

* * * * *